US008922169B2

(12) United States Patent
Sugimura

(10) Patent No.: US 8,922,169 B2
(45) Date of Patent: Dec. 30, 2014

(54) SEMICONDUCTOR CIRCUIT, BATTERY CELL MONITORING SYSTEM, COMPUTER READABLE MEDIUM STORING DIAGNOSTIC PROGRAM AND DIAGNOSTIC METHOD

(75) Inventor: Naoaki Sugimura, Tokyo (JP)

(73) Assignee: Lapis Semiconductor Co., Ltd., Yokohama (JP)

(*) Notice: Subject to any disclaimer, the term of this patent is extended or adjusted under 35 U.S.C. 154(b) by 406 days.

(21) Appl. No.: 13/342,320

(22) Filed: Jan. 3, 2012

(65) Prior Publication Data

US 2012/0176160 A1 Jul. 12, 2012

(30) Foreign Application Priority Data

Jan. 12, 2011 (JP) ................................ 2011-004249

(51) Int. Cl.
*H02J 7/00* (2006.01)
*G01R 31/36* (2006.01)
*G01R 19/165* (2006.01)
*H01M 10/42* (2006.01)
*H01M 10/44* (2006.01)

(52) U.S. Cl.
CPC ....... *G01R 19/16542* (2013.01); *Y02T 10/7055* (2013.01); *H01M 10/4207* (2013.01); *G01R 31/3658* (2013.01); *H01M 2250/20* (2013.01); *H01M 10/441* (2013.01); *Y02T 90/32* (2013.01); *H02J 7/0016* (2013.01)
USPC .......................................... 320/134; 320/136

(58) Field of Classification Search
USPC ......................................................... 320/134
See application file for complete search history.

(56) References Cited

U.S. PATENT DOCUMENTS

| 5,796,303 | A | * | 8/1998 | Vinn et al. ...................... 330/51 |
| 5,923,219 | A | | 7/1999 | Ide et al. |
| 8,649,935 | B2 | | 2/2014 | Kubo et al. |
| 2006/0090534 | A1 | * | 5/2006 | Iwashita et al. ................. 72/351 |
| 2006/0091854 | A1 | * | 5/2006 | Chen et al. ..................... 320/116 |
| 2008/0129252 | A1 | * | 6/2008 | Nishino ........................ 320/162 |

FOREIGN PATENT DOCUMENTS

| JP | H05160732 | A | 6/1993 |
| JP | H10261940 | A | 9/1998 |
| JP | 2002168928 | A | 6/2002 |
| JP | 2007001123 | A | 1/2007 |
| JP | 2008-175804 | | 7/2008 |
| JP | 2009183025 | A | 8/2009 |
| JP | 2010-097549 | | 4/2010 |

OTHER PUBLICATIONS

Japanese Office Action dated Aug. 12, 2014.
Japanese Office Action dated Oct. 28, 2014.

* cited by examiner

*Primary Examiner* — Arun Williams
(74) *Attorney, Agent, or Firm* — Volentine & Whitt, PLLC

(57) ABSTRACT

A semiconductor circuit is provided including a comparator section that compares discharge sections, each including a first signal line connected to a high potential side of each of a plurality of battery cells that are connected in series, a second signal line connected to a low potential side of each of the plurality of battery cells, a resistance element provided between the first signal line and the second signal line, and a discharge switching element connected in series to the resistance element, wherein the comparator section compares a threshold voltage, set according to a potential difference between a potential of the first signal line and a potential of the second signal line, with a voltage according to a potential between the resistance element and the discharge switching element.

9 Claims, 12 Drawing Sheets

SEMICONDUCTOR CIRCUIT, BATTERY CELL MONITORING SYSTEM, COMPUTER READABLE MEDIUM STORING DIAGNOSTIC PROGRAM AND DIAGNOSTIC METHOD

CROSS-REFERENCE TO RELATED APPLICATION

This application claims priority under 35 USC 119 from Japanese Patent Application No. 2011-004249 filed on Jan. 12, 2011, the disclosure of which is incorporated by reference herein.

BACKGROUND OF THE INVENTION

1. Field of the Invention

The present invention relates to a semiconductor circuit, a battery cell monitoring system, a computer readable medium storing a diagnostic program, and a diagnostic method. In particular, the present invention relates to a semiconductor circuit, a battery cell monitoring system, a computer readable medium storing a diagnostic program, and a diagnostic method, employed for battery voltage monitoring.

2. Description of the Related Art

Generally a battery with plural cells (battery cells) connected together in series is employed as a battery for high output with large capacity for use in such applications as drive motors of hybrid vehicles or electric vehicles (a specific example thereof is a lithium ion battery). There are known battery cell monitoring systems for monitoring and controlling voltages of cells in such batteries.

A conventional battery cell monitoring system is configured with a battery cell group including plural battery cells, and a semiconductor circuit for measuring and controlling the voltages of the battery cells contained in the battery cell group.

In a conventional battery cell monitoring system, cell voltage equalization processing (to equalize the voltage values of each of the battery cells) and discharge control processing (to control the discharge voltage of each of the battery cells) is performed on the group of battery cells based on voltage value data of each of the battery cells obtained from a semiconductor circuit for measurement use. In such a battery cell monitoring system, due to appropriate voltage equalization processing not being performed, defects may occur.

Therefore methods for diagnosing faults relating to a discharge circuit are known. Japanese Patent Application Laid-Open (JP-A) No. 2008-175804 discloses a method for diagnosing open failure of switches employed in a discharge circuit, by detecting whether or not voltages from each end of a switch that has been switched ON state are a fixed value or less, or whether or not the voltages from each end of the switch when it has been switched OFF state are higher than a specific voltage. Further, JP-A No. 2010-95449 discloses a chopper-type comparator serving as a comparison circuit and configured with capacitors connected in parallel at the input side.

However, since the above technology requires processing in a dedicated section, such as an abnormality diagnostic section, processing time may be required and the associated power consumption may increase.

SUMMARY OF THE INVENTION

The present invention provides a semiconductor circuit, a battery cell monitoring system, a computer readable medium storing a diagnostic program and a diagnostic method that may appropriately diagnose functioning of a discharge section.

A first aspect of the present invention is a semiconductor circuit including a comparator section that compares discharge sections, each including a first signal line connected to a high potential side of each of a plurality of battery cells that are connected in series, a second signal line connected to a low potential side of each of the plurality of battery cells, a resistance element provided between the first signal line and the second signal line, and a discharge switching element connected in series to the resistance element, wherein the comparator section compares a threshold voltage, set according to a potential difference between a potential of the first signal line and a potential of the second signal line, with a voltage according to a potential between the resistance element and the discharge switching element.

A second aspect of the present invention, in the above aspect, may further include: a reference voltage generating section; a generating section that generates a specific voltage from the voltage generated by the reference voltage generation section; and a grounding section that supplies a ground potential, wherein the comparator section may further compare a threshold voltage, set according to a difference between the voltage generated by the reference voltage generating section and a voltage according to ground potential, with the specific voltage generated by the generating section.

A third aspect of the present invention is a battery cell monitoring system including: a plurality of battery cells connected in series, a discharge section including, a resistance element provided between a first signal line connected to a high potential side of each of the plurality of battery cells and a second signal line connected to a low potential side of each of the plurality of battery cells, and a discharge switching element connected in series to the resistance element; and the semiconductor circuit of according to the first aspect.

A fourth aspect of the present invention is a non-transitory computer readable medium storing a diagnostic program for causing a computer to execute a diagnostic process of a discharge section by a semiconductor circuit, the discharge section including, a first signal line connected to a high potential side of each of a plurality of battery cells connected in series, a second signal line connected to a low potential side of each of the plurality of battery cells, a resistance element provided between the first signal line and the second signal line, and a discharge switching element connected in series to the resistance element, the semiconductor circuit including a comparator section including, a single inverting amplifier, a first capacitor connected to an input of the single inverting amplifier and input with a potential of the first signal line or a potential between the resistance element and the discharge switching element, and a second capacitor connected in parallel to the first capacitor and input with a potential of the second signal line or a potential between the resistance element and the discharge switching element, wherein the comparator section compares a threshold voltage, set according to a potential difference between the potential of the first signal line and the potential of the second signal line, with a voltage according to the potential between the resistance element and the discharge switching element, the diagnostic process including: charging the first capacitor by a potential difference between the potential of the first signal line and the threshold voltage of the single inverting amplifier; charging the second capacitor by a potential difference between the potential of the second signal line and the threshold voltage of the single inverting amplifier; inputting to the first capacitor and the second capacitor a voltage according to the potential between the resistance element and the discharge switching element; and outputting a comparison result from the comparison section.

A fifth aspect of the present invention is a diagnostic method for performing diagnosis of a discharge section by a semiconductor circuit, the discharge section including, a first signal line connected to a high potential side of each of a plurality of battery cells connected in series, a second signal line connected to a low potential side of each of the plurality of battery cells, a resistance element provided between the first signal line and the second signal line, and a discharge switching element connected in series to the resistance element, the semiconductor circuit including a comparator section including a single inverting amplifier, a first capacitor connected to an input of the single inverting amplifier and input with a potential of the first signal line or a potential between the resistance element and the discharge switching element, and a second capacitor connected in parallel to the first capacitor and input with a potential of the second signal line or a potential between the resistance element and the discharge switching element, wherein the comparator section compares a threshold voltage, set according to a potential difference between the potential of the first signal line and the potential of the second signal line, with a voltage according to the potential between the resistance element and the discharge switching element, the diagnostic method including: charging the first capacitor by a potential difference between the potential of the first signal line and the threshold voltage of the single inverting amplifier; charging the second capacitor by a potential difference between the potential of the second signal line and the threshold voltage of the single inverting amplifier; inputting to the first capacitor and the second capacitor a voltage according to the potential between the resistance element and the discharge switching element; and outputting a comparison result from the comparison section.

According to the above aspects, the present invention may appropriate diagnose the functioning of the discharge section.

BRIEF DESCRIPTION OF THE DRAWINGS

Exemplary embodiments of the present invention will be described in detail based on the following figures, wherein.

DETAILED DESCRIPTION OF THE INVENTION

First Exemplary Embodiment

Detailed explanation follows regarding a battery cell monitoring system of a first exemplary embodiment, with reference to the drawings.

Figure 1:
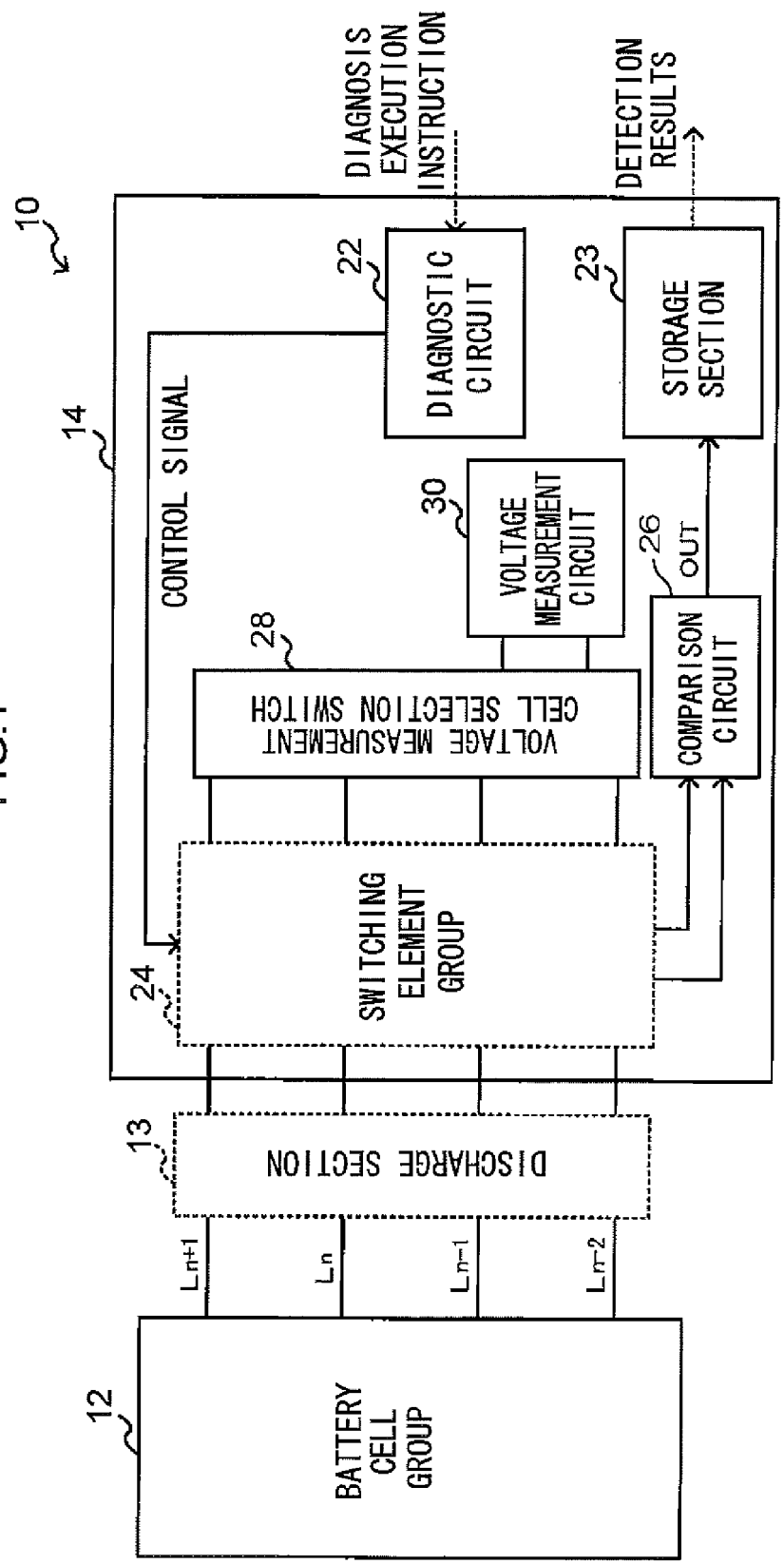
FIG. 1 is a circuit diagram illustrating a schematic configuration of a battery cell monitoring system according to a first exemplary embodiment.

Explanation first follows regarding a configuration of a battery cell monitoring system of the first exemplary embodiment. FIG. 1 illustrates an example of a schematic configuration of a battery cell monitoring system of the first exemplary embodiment. The battery cell monitoring system of the first exemplary embodiment illustrated in FIG. 1 is configured including a battery cell group 12 including plural battery cells, a discharge section 13 for discharging each battery cell of the battery cell group 12, and a semiconductor circuit 14 for measuring the voltage of each of the battery cells in the battery cell group 12.

The discharge section 13 is configured including a discharge circuit (see discharge circuit 51 of FIG. 2, described in detail later), and a low pass filter (LPF) (see LPF in FIG. 2, described in detail later).

The semiconductor circuit 14 is configured including a diagnostic circuit 22, a storage section 23, a switching element group 24, a comparison circuit 26, a voltage measurement cell selection switch 28 and a voltage measurement circuit 30.

The diagnostic circuit 22 is a logical circuit that diagnose an equalization function (described in detail later) of the discharge section 13 based on output OUT that is output from the comparison circuit 26. On receipt of an external instruction to execute diagnosis of the equalization function, the diagnostic circuit 22 outputs a control signal to control ON and OFF switching such as in the switching element group 24 employed for discharge interruption.

The storage section 23 stores the output OUT that has been output from the comparison circuit 26 (logic values expressing H level or L level), with a specific example thereof being a register. In the first exemplary embodiment the discharge section 13 performs self-diagnosis on the equalization function of the discharge section 13 (the discharge circuit 51) based on the logic value stored in the storage section 23.

Figure 2:
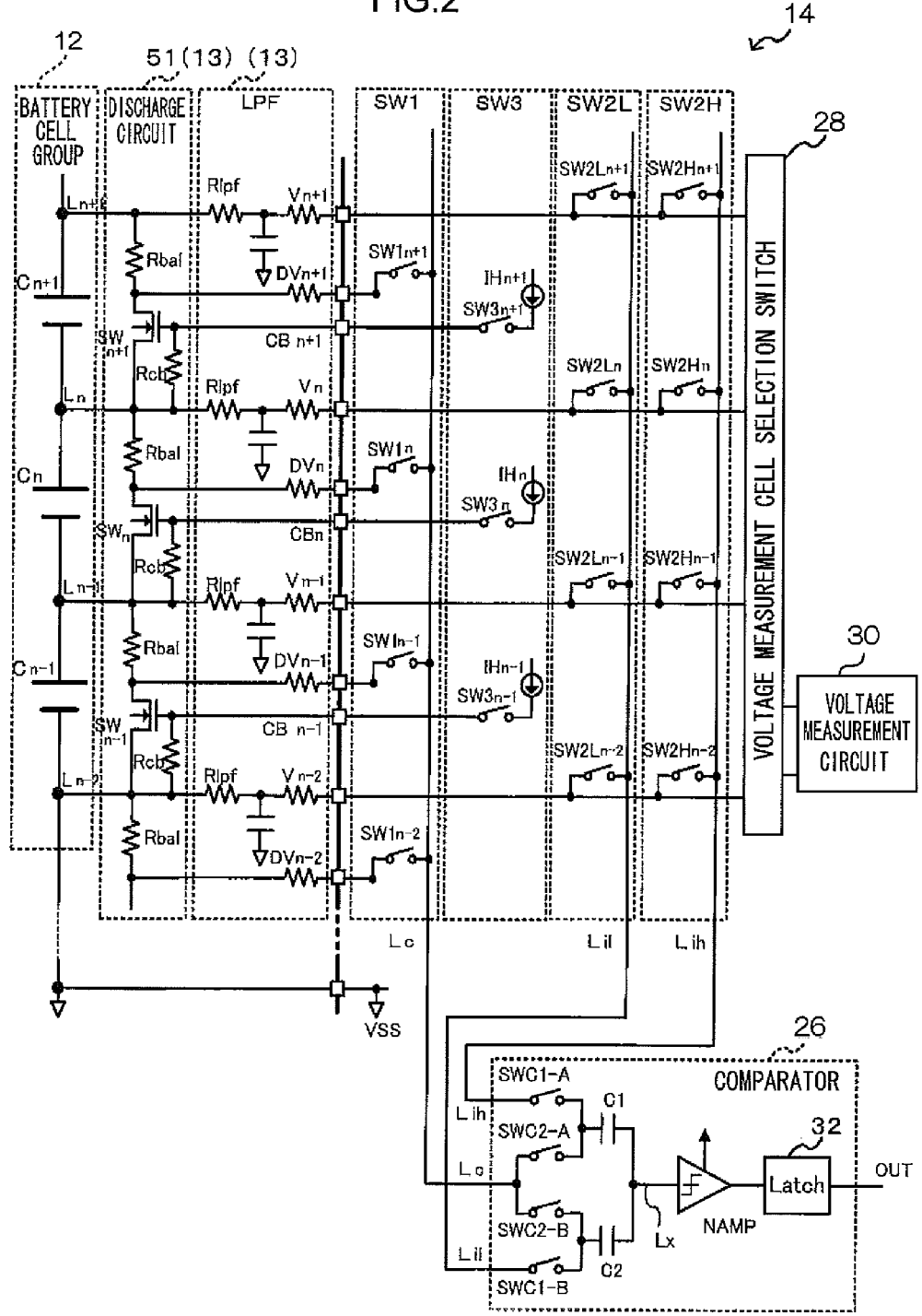
FIG. 2 is a circuit diagram illustrating a schematic configuration of a semiconductor circuit according to the first exemplary embodiment.

FIG. 2 illustrates an example of a schematic configuration of the discharge section 13 and the semiconductor circuit 14 according to the first exemplary embodiment. The semiconductor circuit 14 of the first exemplary embodiment diagnoses the equalization function performed by the discharge circuit 51 (or more specifically by equalization switching elements SW). Note that in the first exemplary embodiment, as a specific example, the battery cell group 12 is configured to include 3 cells C (Cn−1 to Cn+1, referred to by the general term cells C) and is connected to the semiconductor circuit 14 through the discharge section 13 by signal lines Ln−2 to Ln+1 (referred to by the general term signal lines L). The diagnostic circuit 22 and the storage section 23 are omitted in FIG. 2.

The discharge section 13 of the first exemplary embodiment illustrated in FIG. 2 is configured including the discharge circuit 51 and the LPF.

The discharge circuit 51 shorts between the high potential side and low potential side of each of the battery cells C of the battery cell group 12, to equalize the potentials of the cells C by discharging the cells. The discharge circuit 51 includes equalization switching elements SW (SW n−1 to SW n+1, referred to below by the general term equalization switching elements SW). In the present exemplary embodiment an NMOS transistor is employed, as a specific example, for each of the equalization switching elements SW, with the drain of the NMOS transistor connected to a signal line L on the high potential side of the battery cell C through a resistance element Rba1, for limiting the discharge amount of the cell C, and the source of the NMOS transistor connected to the signal line L on the low potential side of the battery cell C. The gate of the NMOS transistor is connected to the switching element SW 3 and to the signal line L on the low potential side of a resistance element Rcb, serving as a pull-down resistor. When the gate of the equalization switching element SW is switched ON, the terminals of the cell C are shorted, and the charge in the battery cell C is discharged. In the present exemplary embodiment, control to switch the gate of each of the equalization switching elements SW ON or OFF is performed by a voltage adjusting section IH (described in detail later) of the switching element SW 3. The voltage adjusting section IH is a constant current power source, and the equalization switching element drive current flowing from the voltage adjusting section IH is fed to signal lines CB to switch the gates of the equalization switching elements SW ON.

The LPF suppresses steep voltage fluctuations generated in each cell C of the battery cell group 12 by cutting out high frequency components. The LPF is connected to the signal line L on the high potential side of each of the cells C.

The semiconductor circuit 14 shown in FIG. 2 is configured including the switching element group 24, the comparison circuit 26, the voltage measurement cell selection switch 28 and the voltage measurement circuit 30. The switching element group 24 is configured with switching elements SW 1, switching elements SW 2L, SW 2H and the switching elements SW 3 including the voltage adjusting section IH.

The semiconductor circuit 14 includes the signal lines L connecting together the battery cell group 12 and the discharge section 13, signal lines V connecting the LPF to the voltage measurement cell selection switch 28, signal lines CB connecting the gates of the switching elements SW of the discharge circuit 51 to the switching elements SW 3, and signal lines DV connecting the signal lines L of the high potential side of the cell C to the switching elements SW 1 through the resistance elements Rba1.

The voltage measurement cell selection switch 28 includes plural internal switching elements (not shown in the drawings), and select the voltage on the high potential side (signal line L) and the voltage on the low potential side (signal line L) of the cell C to which measurement and monitoring of the battery voltage is to be performed, by switching the internal switching elements. The voltage measurement circuit 30 measures the battery voltage of the cell C based on the voltages selected by the voltage measurement cell selection switch 28.

Each of the switching elements SW 1 has a function of connecting the respective signal line DV to the respective signal line Lc. The signal lines DV and the signal lines Lc of the discharge circuit 51 for performing diagnosis are connected together based on a control signal from the diagnostic circuit 22. The switching elements SW 1 are provided with one of the switching elements SW 1 (SW 1n−2 to SW 1n+1, sometimes referred to collectively as switching elements SW 1) for each of the signal lines DV.

The switching elements SW 2L, SW 2H are provided for each of the signal lines V (SW 2Ln−2 to SW 2Ln+1, referred so sometimes as switching elements SW 2L, and SW 2Hn−2 to SW 2Hn+1, referred so sometimes as switching elements SW 2H). Each of the switching elements SW 2L connect the respective signal line V to the signal line Lil based on a control signal from the diagnostic circuit 22. Each of the switching elements SW 2H connect the respective signal line V to the signal line Lih based on a control signal from the diagnostic circuit 22.

The switching element SW 3 is configured including the switching elements SW 3H and the voltage adjusting sections IH that are constant current power sources. The switching elements SW 3H and the voltage adjusting sections IH are provided one for each signal line CB (SW 3 n−1 to SW 3 n+1, sometimes referred to collectively as switching elements SW 3. Similarly the individual suffixes are omitted when referring to the voltage adjusting sections IH in general).

Each of the switching elements SW 3H connects the respective signal line CB to the voltage adjusting section IH. When performing equalization (discharging) of the cells C, the element SW 3H is switched ON, to apply the equalization switching element drive voltage from the voltage adjusting section IH to the gate of the respective switching element SW.

The comparison circuit (comparator) 26 of the present exemplary embodiment is configured as a chopper-type comparator. The comparison circuit 26 is configured including switching elements SWC 1-A, SWC 2-A, SWC 1-B, SWC 2-B, capacitors C1, C2, a single inverting amplifier NAMP of an auto-threshold voltage Vx and a latch circuit (latch) 32.

The switching element SWC 1-A connects the signal line Lih to the capacitor C1, and the switching element SWC 2 A has a function for connecting the signal line Lc to the capacitor C1. The switching element SWC 1-B connects the signal line Lil to the capacitor C2, and the switching element SWC 2-B connects the signal line Lc to the capacitor C2.

The latch circuit 32 ascertains the logic value (H level or L level) from the output voltage of the single inverting amplifier NAMP, and output the logic value.

Explanation follows regarding self-diagnostic processing of the equalization function. As a specific example, explanation follows regarding a case of performing self-diagnostic process of an equalization switching element SWn. When performing self-diagnostic process of the equalization switching element SWn, the state of the potential of the signal line DVn, with respect to the difference between the potential of the signal line Vn and the potential of the signal line signal line V n−1, is monitored by the comparison circuit 26, and self-diagnosis of equalization function is made. In the present exemplary embodiment, as a specific example, a threshold value is set at 50% of the difference between the potential of the signal line Vn and the potential of the signal line Vn−1, and a normal operation state (equalization switching element SWn is OFF) is taken as being when the difference between the potential of the signal line DVn and the potential of the signal line Vn−1 is the threshold value or greater, and as indicating an equalization function operating state when less than the threshold value.

The self-diagnostic process of the equalization function of the present exemplary embodiment is divided into an initialization operation and a comparison operation.

Figure 3:
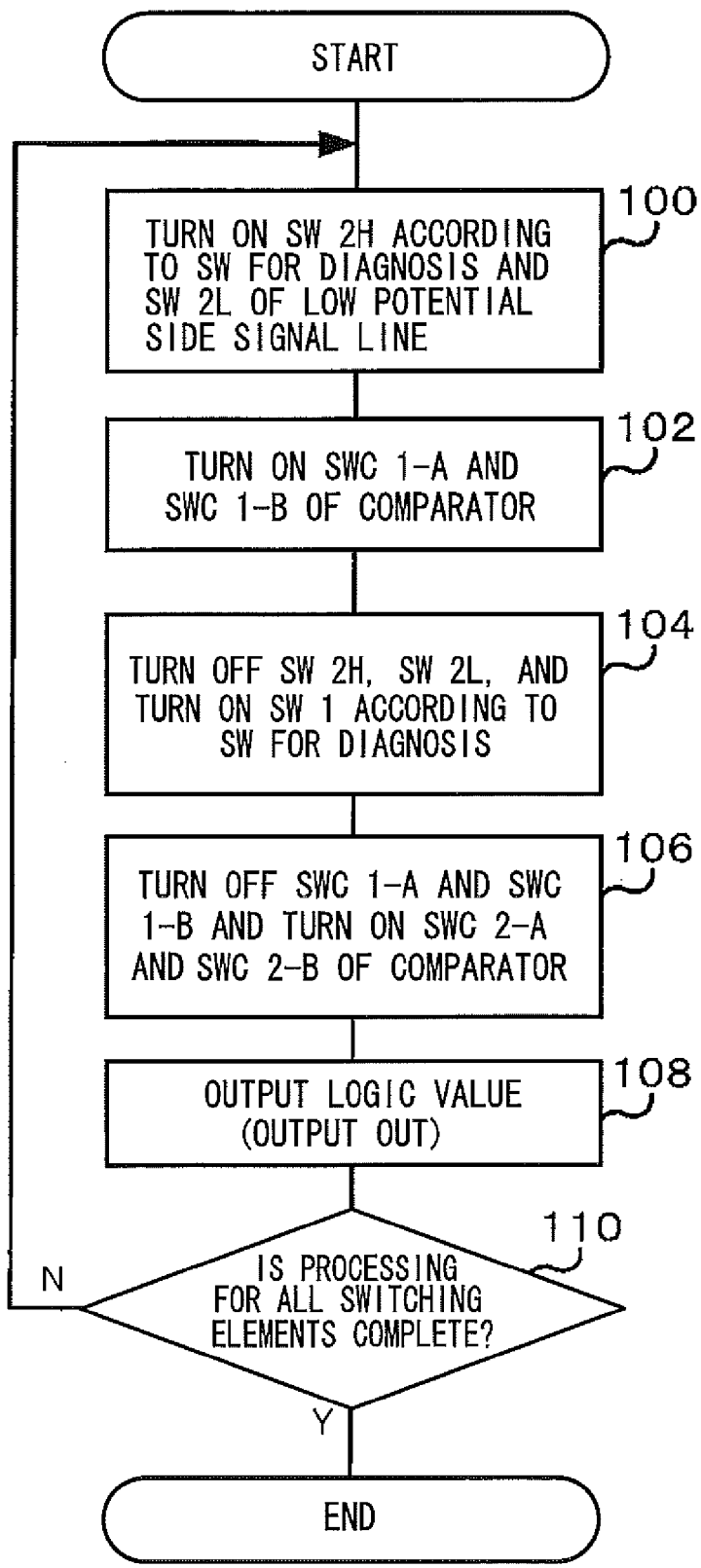
FIG. 3 is a flow chart illustrating process flow in self-diagnosis of an equalization function according to the first exemplary embodiment.
Figure 4:
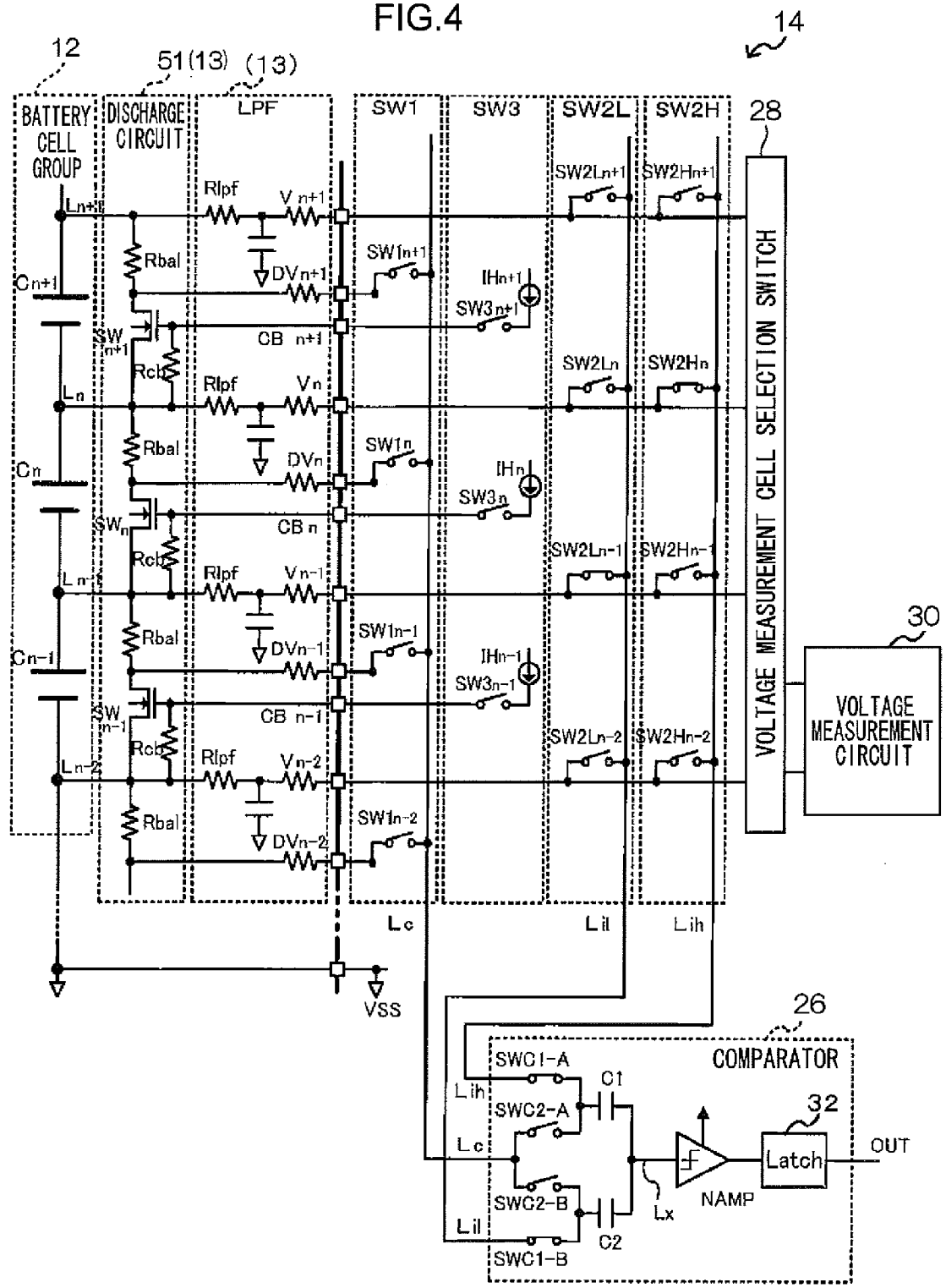
FIG. 4 is a circuit diagram illustrating a state of a semiconductor circuit during initialization operation according to the first exemplary embodiment.
Figure 5:
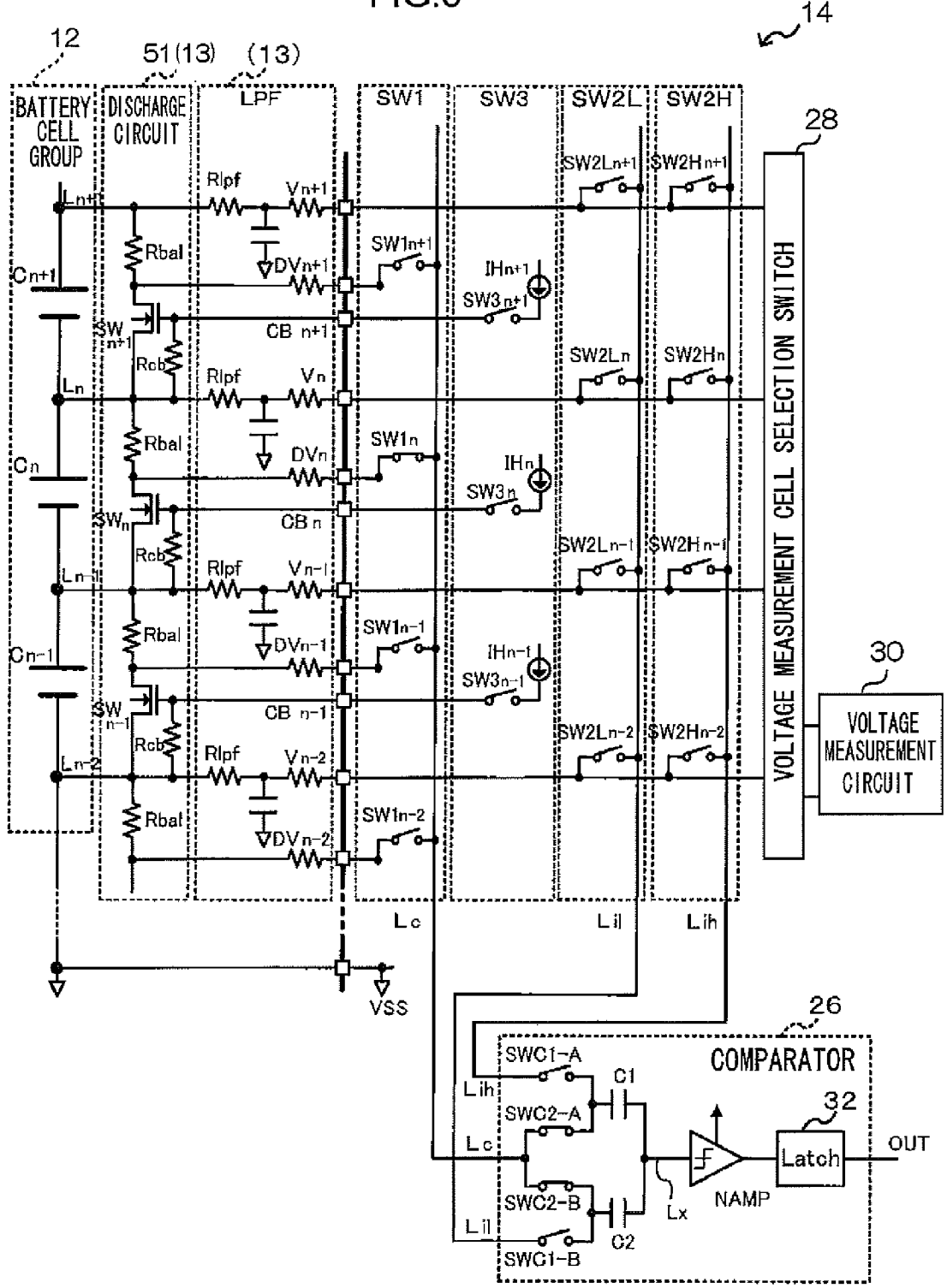
FIG. 5 is a circuit diagram illustrating a state of a semiconductor circuit during comparison operation according to the first exemplary embodiment.

FIG. 3 illustrates a flow chart showing an example of overall flow in self-diagnostic process of equalization function of the present exemplary embodiment. FIG. 4 is a circuit diagram illustrating a state of the semiconductor circuit 14 during initialization operation, and FIG. 5 is a circuit diagram illustrating a state of the semiconductor circuit 14 during comparison operation.

At step 100, the switching elements SW 2H, SW 2L are switched ON according to the equalization switching element SW for which the equalization function is to be diagnosed. As a specific example, the switching elements SW 2Hn, SW 2Ln-1 are switched ON (see FIG. 4). The signal line Vn is connected to the signal line Lih by switching the switching element SW 2Hn ON. The signal line Vn-1 is connected to the signal line Lil by switching the switching elements SW 2Ln-1 ON.

Then at step 102, the switching element SWC 1-A of the comparison circuit 26 is switched ON (see FIG. 4). This results in the capacitor C1 achieving a charged state by the difference between the voltage of the signal line Vn and the auto-threshold voltage Vx (voltage of signal line Vn–auto-threshold voltage Vx). The switching element SWC 1-B of the comparison circuit 26 is also switched ON (see FIG. 4). This results in the capacitor C2 achieving a charged state by the difference between the voltage of the signal line Vn-1 and the auto-threshold voltage Vx (voltage of the auto-threshold voltage Vx–signal line Vn-1). When, charges of the capacitor C1 is denoted as Q1 and the electrostatic capacitance is denoted as C1, and charges of the capacitor C2 is denoted as Q2 and the electrostatic capacitance is denoted as C2, the Charges Q1, Q2 may be expressed as the following expression (1) and expression (2).

$$Q1 = C1 \times (Vn - Vx) \qquad (1)$$

$$Q2 = C2 \times (Vx - V(n-1)) \qquad (2)$$

Note that, Step 100 and step 102 correspond to the initialization operation of the present exemplary embodiment.

When the initialization operation has been completed, at the next step 104, the switching elements SW 2H, SW 2L that were switched ON for the initialization operation are switched OFF, and the switching element SW 1 is switched ON according to the equalization switching element SW for equalization function diagnosis. As a specific example, the switching elements SW 2Hn, SW 2Ln-1 are switched OFF, and the switching element SW 1n is switched ON (see FIG. 5). The signal line DVn is connected to the signal line Lc by switching ON the switching element SW 1n.

Then, at step 106, the switching element SWC 1-A of the comparison circuit 26 is switched OFF and the switching element SWC 2-A is switched ON. Further, the switching element SWC 1-B is switched OFF and the switching element SWC 2-B is switched ON. Then, at step 108, a logic value (output OUT) from the comparison circuit 26 is also output.

When the input voltage to the NAMP at this state is denoted as Vx', the charge for the capacitor C1 is denoted as Q1', and the charge for the capacitor C2 is denoted as Q2', charges Q1', Q2' may be expressed as the following expression (3) and expression (4), at this stage.

$$Q1' = C1 \times (DVn - Vx') \qquad (3)$$

$$Q2' = C2 \times (Vx' - DVn) \qquad (4)$$

The following expression (5) is satisfied due to conservation of charge.

$$-Q1 + Q2 = -Q1' + Q2' \qquad (5)$$

Accordingly, from expression (1) to expression (5): becomes $$-C1 \times (Vn - Vn) + C2 \times (Vx - V(n-1)) = -C1 \times (DVn - Vx') + C2 \times (Vx' - DVn),$$

and the following expression (6) can be obtained.

$$Vx' - Vx = (DVn - V(n-1)) - C1/(C1 + C2) \times (Vn - V(n-1)) \qquad (6)$$

The following expression (7) arises, when V nampout is denoted as the output voltage and G namp is denoted as the gain of the single inverting amplifier NAMP.

$$V\text{nampout} = -G\text{namp} \times (Vx' - Vx) \qquad (7)$$

When gain G namp is sufficiently high, the output logic value of the single inverting amplifier NAMP is determined by the sign (positive or negative) of the voltage Vx'–auto-threshold voltage Vx, and the proportion of the threshold value (Vn–V(n-1)) is determined by the capacitance ratio of electrostatic capacitance C1 to electrostatic capacitance C1+electrostatic capacitance C2.

In the present exemplary embodiment, as a specific example, since the capacitance ratio electrostatic capacitance C1:electrostatic capacitance C2=1:1, 1/(1+1)=½, and the threshold value is 50% as referred to above, and the following expression (8) applies.

$$Vx' - Vx = (DVn - V(n-1)) - \tfrac{1}{2} \times (Vn - V(n-1)) \qquad (8)$$

Accordingly, the sign (positive or negative) of voltage Vx'–auto-threshold voltage Vx can be determined as follows.

When DVn-V(n-1)>0.5×(Vn-V(n-1), Vx'-Vx>0, the output OUT of the comparison circuit 26 becomes L level.

However, when DVn-V(n-1)<0.5×(Vn-V(n-1), Vx'-Vx<0, the output OUT of the comparison circuit 26 becomes H level.

When the equalization switching element SWn is not in operation (when the equalization switching element drive current is not being supplied), during correct operation, becomes DVn-V(n-1)>0.5×(Vn-V(n-1)) due to the ON state of the equalization switching element, and so output OUT becomes L level. However, during malfunction (when not operating correctly), becomes DVn-V(n-1)<0.5×(Vn-V(n-1)), and so output OUT becomes H level.

However when equalization switching element SWn is in operation (when the equalization switching element drive current is being supplied), during correct operation, becomes, DVn-V(n-1)<0.5×(Vn-V(n-1)) due to the equalization switching element being in the ON state, and so the output OUT becomes H level. However, during malfunction (when not operating correctly) becomes, DVn-V(n-1)>0.5×(Vn-V(n-1)), and so output OUT becomes L level.

At step 110, determination is made as to whether or not the processes of steps 100 to 108 have been performed for all of the equalization switching elements SW. When negative determination is made, process returns to step 100 and the above process is repeated. However, when process has been performed for all of the equalization switching elements SW the current process is ended, since self-diagnostic process of the equalization function has been completed for all the equalization switching elements SW.

The results of output OUT in the present exemplary embodiment are shown in Table 1.

TABLE 1

| Equalization Switching Element Drive Current | Comparison Operation Output Out Logic Value | | |
|---|---|---|---|
| OFF | H level | DVn − V (n − 1) < 0.5 × (Vn − V (n − 1)) | Malfunction |
| OFF | L level | DVn − V (n − 1) > 0.5 × (Vn − V (n − 1)) | Correct Normal Operation |
| ON | H level | DVn − V (n − 1) < 0.5 × (Vn − V (n − 1)) | Correct Normal Operation |
| ON | L level | DVn − V (n − 1) > 0.5 × (Vn − V (n − 1)) | Malfunction |

Note that in the present exemplary embodiment the output OUT output by the comparison circuit 26 is detected, and self-diagnosis of equalization function is performed for the equalization switching elements SW based on above Table 1. In the present exemplary embodiment specific measures are adopted when malfunction is diagnosed such as, for example, stopping operation of the battery cell monitoring system 10.

As explained above, in the semiconductor circuit 14 of the present exemplary embodiment, in order to perform diagnosis of the equalization (discharging) function of the equalization switching elements SWn of the discharge circuit 51, by initialization operation, the capacitor C1 of the comparison circuit 26 is charged by the difference between the voltage of the signal line Vn and the auto-threshold voltage Vx (signal line Vn−auto-threshold voltage Vx), and the capacitor C2 is charged by the difference between the voltage of the signal line Vn−1 and the auto-threshold voltage Vx (auto-threshold voltage Vx−signal line Vn−1). In the comparison operation, the signal line DVn is connected to the signal line Lc and the capacitors C1, C2 are connected together so as to input the voltage DVn to the capacitors C1, C2, and when equalization processing is not being performed (normal processing with the equalization switching elements SWn switched OFF), then correct functioning is diagnosed when the output OUT=L level, and malfunctioning is diagnosed when output OUT=H level. However, when equalization processing is being performed (the equalization switching element SWn is switched ON), then correct functioning is diagnosed when the output OUT=H level, and malfunctioning is diagnosed when output OUT=L level.

In the semiconductor circuit 14 of the present exemplary embodiment, self-diagnosis of equalization function is performed by the comparison circuit 26 monitoring the potential state of the signal line DVn with respect to the difference between the potential of the signal line Vn and the potential of the signal line Vn−1.

Accordingly, since self-diagnosis of equalization function can be executed without requiring any dedicated configuration components or the like, time required for processing may be suppressed and power consumption may be suppressed while still enabling appropriate equalization function diagnosis to be performed.

Second Exemplary Embodiment

Explanation follows regarding a semiconductor circuit in a battery cell monitoring system of a second exemplary embodiment of the present invention, with reference to the drawings. The semiconductor circuit of the second exemplary embodiment, in addition to the self-diagnostic function of the equalization function of the first exemplary embodiment also has a function for performing diagnostic process of a comparison circuit (chopper-type comparator) 26.

Figure 6:
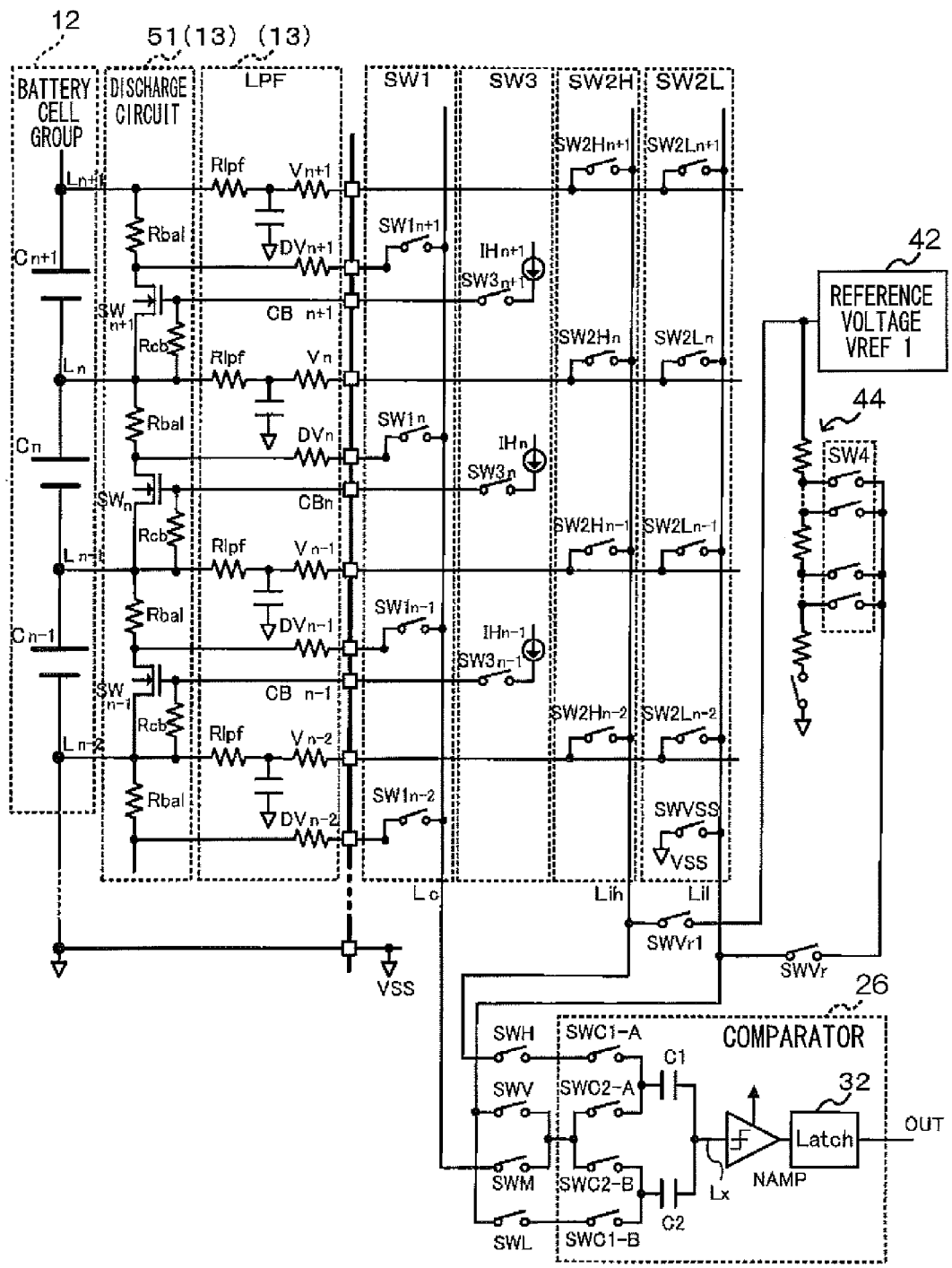
FIG. 6 is a circuit diagram illustrating a schematic configuration of a semiconductor circuit according to a second exemplary embodiment.

FIG. 6 illustrates an example of a schematic configuration of a semiconductor circuit 40 of the second exemplary embodiment. In the second exemplary embodiment, similar configurations and operations to those of the first exemplary embodiment are indicated with same numerals, and further explanation thereof is omitted.

In order to perform self-diagnosis of the comparison function of the chopper-type comparator 26, the semiconductor circuit 40 of the present exemplary embodiment is configured including: a reference voltage generation circuit 42 for generating a reference voltage VREF 1; a dividing resistor 44 for generating voltage of a specific voltage value from the reference voltage VREF 1 generated by the reference voltage generation circuit 42; and a selection switching element SW 4 for selecting a voltage value. The switching element SW 4 includes plural switching elements, and selects and extracts a specific voltage from the dividing resistor 44 by switching specific switching element ON. The reference voltage generation circuit 42 also includes: a switching element SWVr1 for connecting together the reference voltage generation circuit 42 and the signal line Lih and supplying the reference voltage VREF 1 to the signal line Lih; a switching element SWVr for connecting together the selection switching element SW 4 and the signal line Lil and supplying a specific voltage to the signal line Lil; and switching elements SWH, SWV, SWM, SWL. The signal line Lil is also equipped with a switching element SWVSS for supplying ground voltage (VSS).

Figure 7:
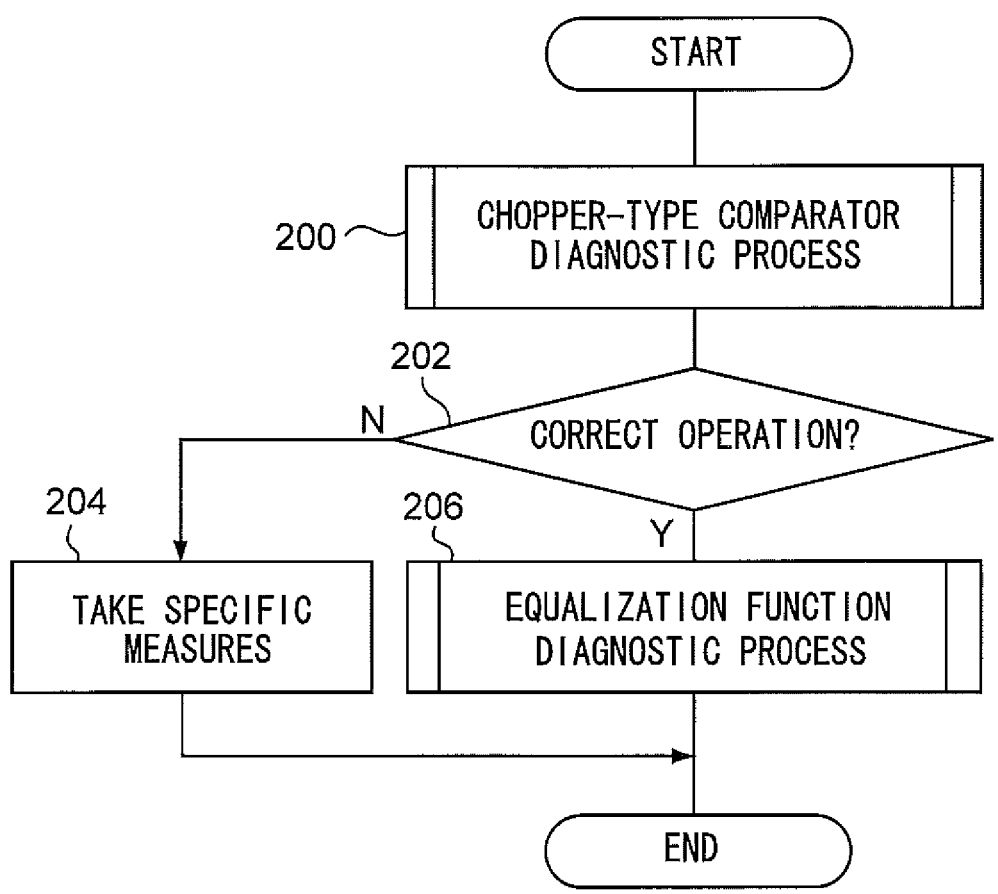
FIG. 7 is a flow chart illustrating overall flow of diagnostic process according to a second exemplary embodiment.

Overall explanation follows regarding self-diagnostic processing of equalization function in the present exemplary embodiment. FIG. 7 is a flow chart illustrating an example of overall flow in equalization function self-diagnostic processing.

In step 200, diagnostic process of a chopper-type comparator 26 is performed, and at the next step 202, determination is made as to whether or not correct operation is occurring based on the logic value of output OUT output from the chopper-type comparator 26 by the diagnostic process of step 200. When negative determination is made, namely when correct operation is not occurring (malfunction), process proceeds to step 204, and process is ended after specific measures have been taken. However, when affirmative determination has been made in step 202 that correct operation is occurring, processing proceeds to step 206, and after performing equalization function self-diagnostic process, the current process is ended. The equalization function self-diagnostic processing of step 206 is substantially the same as that of the first exemplary embodiment, and therefore detailed explanation thereof is omitted. Detailed explanation follows regarding the diagnostic processing of the chopper-type comparator 26 in step 200.

Figure 8:
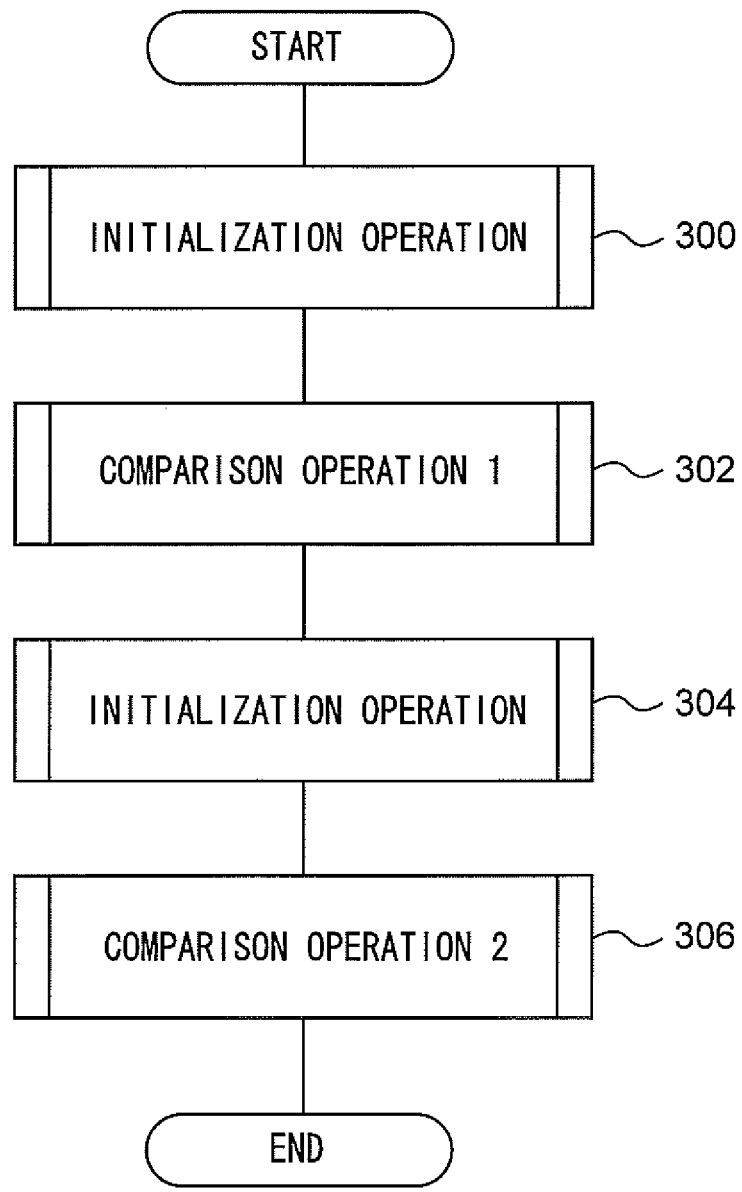
FIG. 8 is a flow chart illustrating overall flow of chopper-type comparator diagnostic processing according to the second exemplary embodiment.

FIG. 8 illustrates an example of the flow of diagnostic process of the chopper-type comparator 26 of the present exemplary embodiment. In step, 300 initialization operation is performed and the capacitors C1, C2 in the chopper-type comparator 26 are charged. In the next step 302, a comparison operation 1 is performed as a comparison against a voltage 60% of reference voltage VREF 1. In the next step 304, the initialization operation is again performed and the capacitors C1, C2 in the chopper-type comparator 26 are charged. Then, in the next step, 306 a comparison operation 2 is performed as a comparison against a voltage 40% of the reference voltage VREF 1, before end of process.

Figure 9:
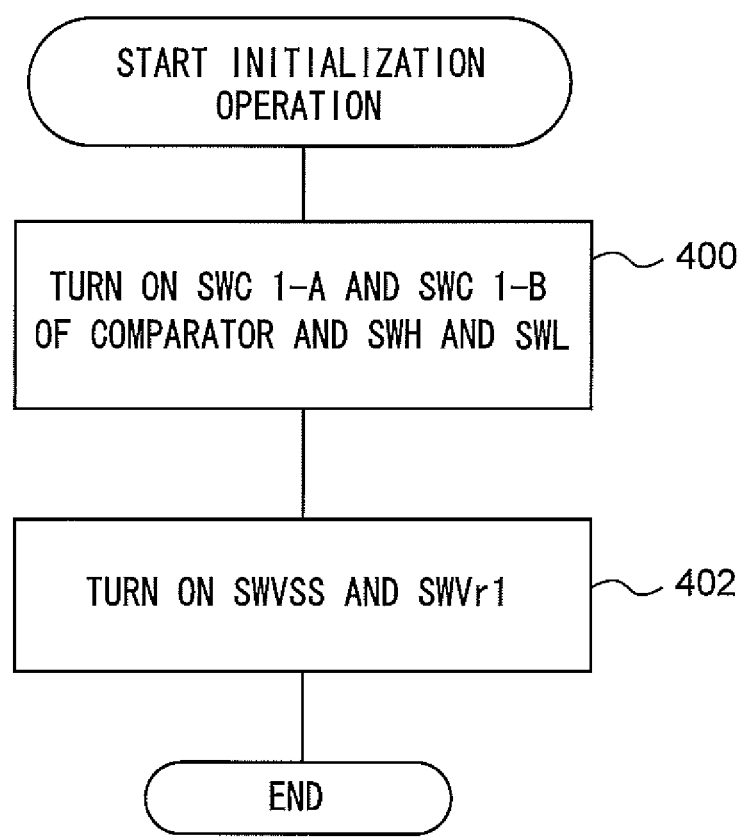
FIG. 9 is a flow chart illustrating flow of initialization operation of chopper-type comparator diagnostic process according to the second exemplary embodiment.
Figure 11:
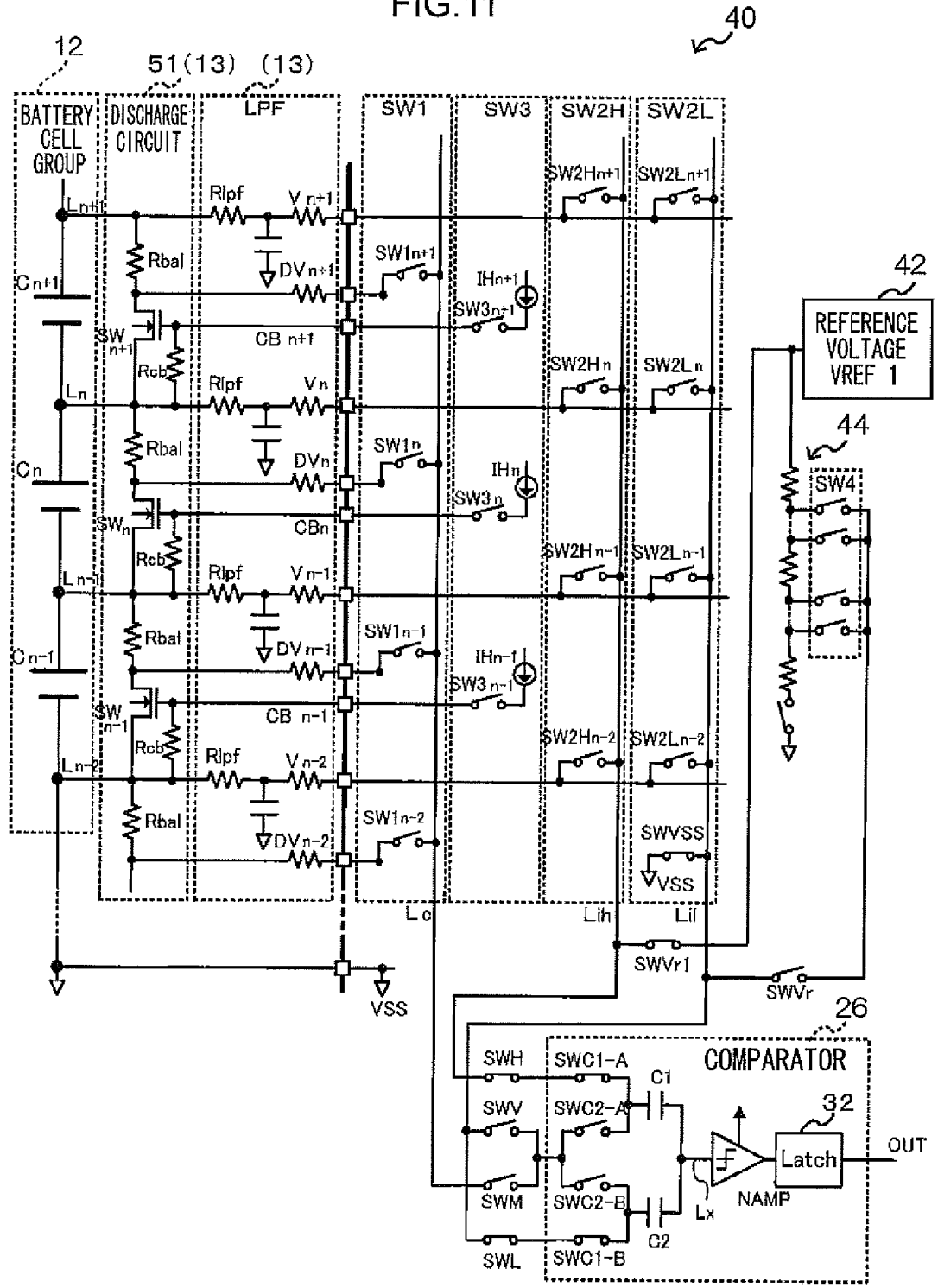
FIG. 11 is a circuit diagram illustrating a state of a semiconductor circuit in initialization operation of chopper-type comparator diagnostic process according to the second exemplary embodiment.

Detailed explanation follows regarding each operation. Explanation follows first regarding the initialization operations of step 300 and step 304. In the present exemplary embodiment, the initialization operations at both steps are similar operations to each other. FIG. 9 is a flow chart illustrating an example of the initialization operation. FIG. 11 illustrates a circuit diagram showing a state of the semiconductor circuit 40 during the initialization operation.

In the initialization operation of step 400, the switching elements SWC 1-A, SWC 1-B of the chopper-type comparator 26 are switched ON, and the switching elements SWH, SWL are switched ON. Then, in step 402, processing is ended after switching the switching elements SWVSS, SWVr1 ON. The reference voltage VREF 1 is supplied to the capacitor C1 by switching ON the switching elements SWVr1, SWH, SWC 1-A. The ground voltage VSS is supplied to the capacitor C2 by switching the switching elements SWVSS, SWL, SWC 1-B ON. Accordingly, the capacitors C1, C2 have charges Q1, Q2 that satisfy the following expression (9) and expression (10).

$$Q1 = C1 \times (VREF1 \times Vx) \quad (9)$$

$$Q2 = C2 \times (Vx - VSS) \quad (10)$$

The capacitors C1, C2 are charged due to the above initialization operation.

Figure 10:
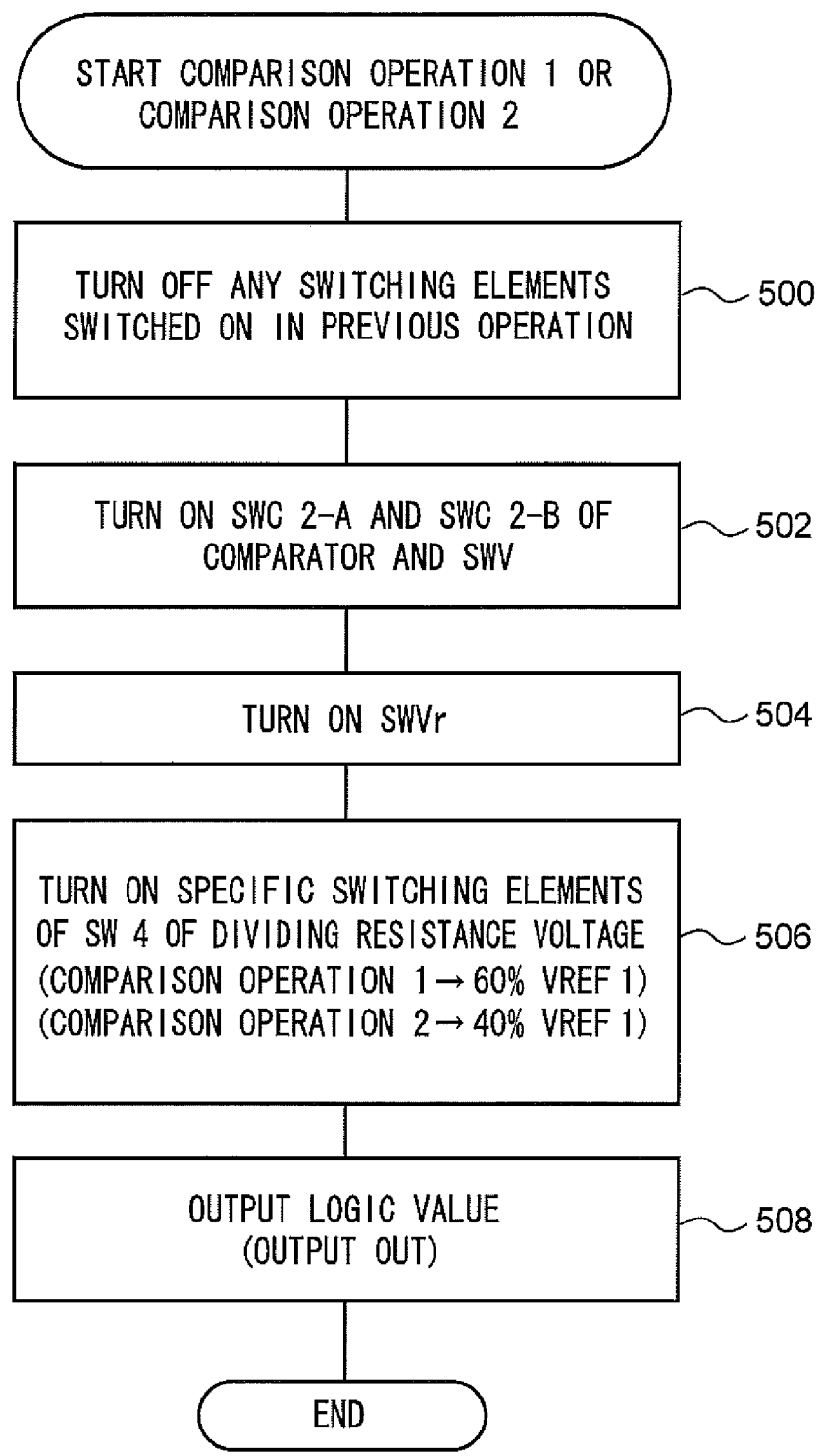
FIG. 10 is a flow chart illustrating flow in a comparison operation 1 and a comparison operation 2 of chopper-type comparator diagnostic process according to the second exemplary embodiment.
Figure 12:
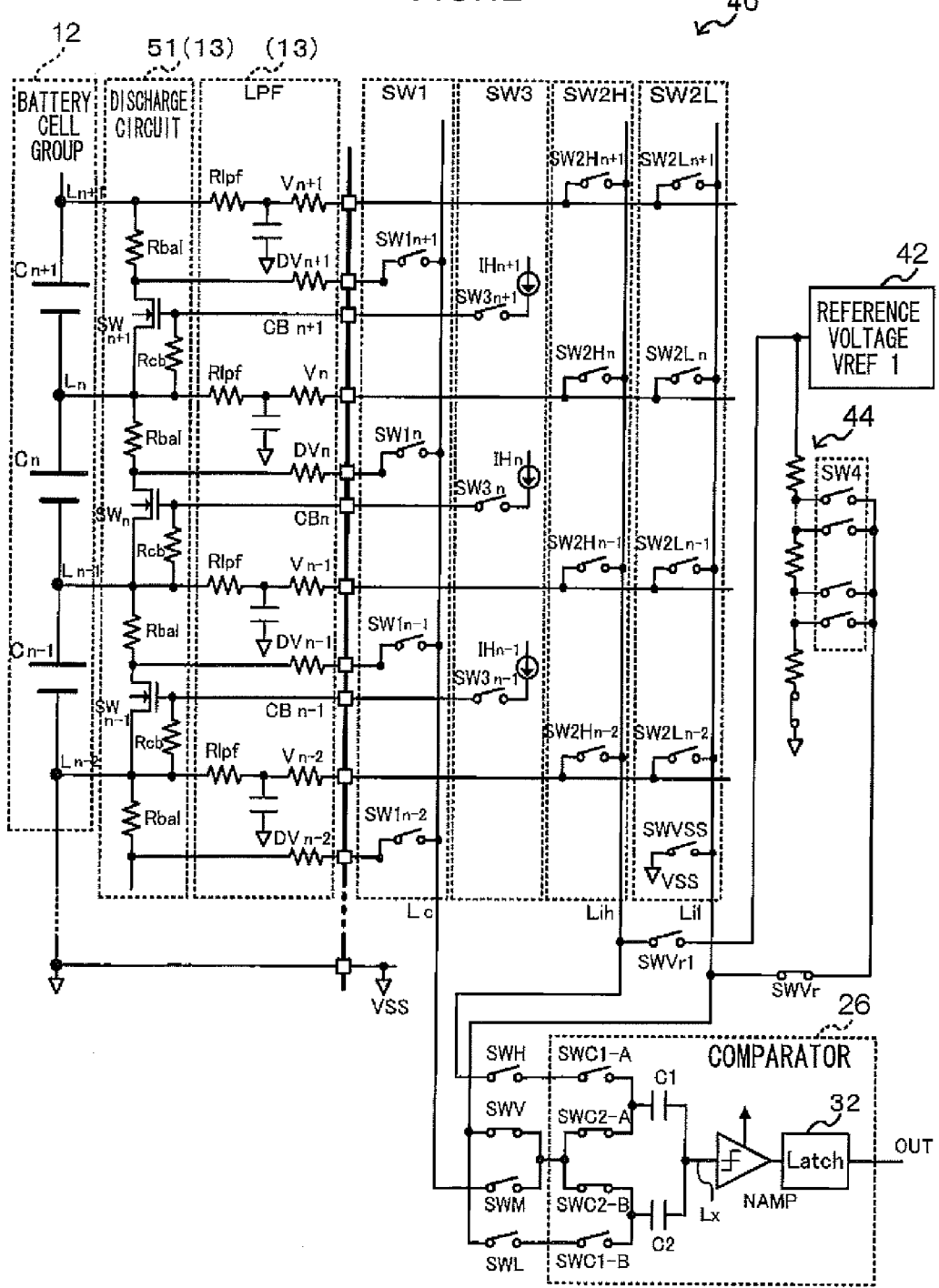
FIG. 12 is a circuit diagram illustrating a state of a semiconductor circuit in comparison operation 1 and comparison operation 2 of chopper-type comparator diagnostic process according to the second exemplary embodiment.

Explanation follows regarding comparison operation 1 of step 302 and comparison operation 2 of step 306, performed after completing the initialization operation. In the present exemplary embodiment, the comparison operation 1 and the comparison operation 2 are substantially similar operations to each other, and have similar operation flows. FIG. 10 is a flow chart illustrating an example of the comparison operation 1 and the comparison operation 2. FIG. 12 is a circuit diagram illustrating a state of a semiconductor circuit 40 during the comparison operation 1 and the comparison operation 2.

At step 500 of the comparison operation 1 and the comparison operation 2, the switching elements that were switched ON in the previous operation (the initialization operation) are switched OFF.

In the next step 502, the switching elements SWC 2-A, SWC 2-B and the switching element SWV of the chopper-type comparator 26 are switched ON, and, in the next step 504, the switching element SWVr is switched ON. Accordingly, a specific voltage generated by a dividing resistor 44 from the reference voltage VREF 1 is supplied to the capacitors C1, C2 of the chopper-type comparator 26.

In the next step 506, for the comparison operation 1 switching elements in the switching element SW 4 for selecting the voltage value of 60% of the reference voltage VREF 1 are switched ON. However, in step 506, for the comparison operation 2 switching elements in the switching element SW 4 for selecting the voltage value of 40% of the reference voltage VREF 1 are switched ON.

In the next step 508, a logic value (output OUT) is output from the chopper-type comparator 26 before ending the current processing.

At this stage, if the input voltage to the NAMP is denoted as Vx', the charge of the capacitor C1 is denoted as Q1', and the charge of capacitor C2 is denoted as Q2', the charges Q1', Q2' in the comparison operation 1 may be expressed by the following expression (11) and expression (12), and in the comparison operation 2, may be expressed by the following expression (13) and expression (14).

$$Q1' = C1 \times (VREF1 \times 0.6 - Vx') \quad (11): \text{comparison operation 1}$$

$$Q2' = C2 \times (Vx' - VREF1 \times 0.6) \quad (12): \text{comparison operation 1}$$

$$Q1' = C1 \times (VREF1 \times 0.4 - Vx') \quad (13): \text{comparison operation 2}$$

$$Q2' = C2 \times (Vx' - VREF1 \times 0.4) \quad (14): \text{comparison operation 2}$$

Similar to in the first exemplary embodiment, since expression (5) above is satisfied due to the law of conservation of charge, in the comparison operation 1, according to expression (5), expression (11) and expression (12), becomes, $-C1 \times (VREF\ 1-Vx)+C2 \times (Vx-VSS) = -C1 \times (VREF\ 1 \times 0.6 - Vx') + C2 \times (Vx' - VREF\ 1 \times 0.6)$. In the comparison operation 2, according to expression (5), expression (13) and expression (14), becomes $-C1 \times (VREF\ 1 - Vx) + C2 \times (Vx \times VSS) = -C1 \times (VREF\ 1 \times 0.4 - Vx') + C2 \times (Vx' - VREF\ 1 \times 0.4)$.

Furthermore, similar to the first exemplary embodiment, when the gain G 0 is sufficiently high, the output logic of the single inverting amplifier NAMP is determined by the plus or minus sign of voltage Vx'–auto-threshold voltage Vx, determining the capacitance ratio of the electrostatic capacitance C1 to electrostatic capacitance C1+electrostatic capacitance C2. In the present exemplary embodiment, a capacitance ratio of 1:1 is taken as a specific example of the electrostatic capacitance C1: electrostatic capacitance C2.

Accordingly, in comparison operation 1, when operating correctly, the output OUT of the chopper-type comparator 26 becomes L level. However, during malfunction (when not operating correctly) the output OUT becomes H level.

However, in comparison operation 2, when operating correctly, the output OUT of the chopper-type comparator 26 becomes H level. However, during malfunction (when not operating correctly), the output OUT becomes L level.

Results of the output OUT in the present exemplary embodiment are shown in Table 2.

TABLE 2

|  | Comparison Operation 1 | Comparison Operation 2 |
| --- | --- | --- |
| No Malfunction (OK) | L level | H level |
| Malfunction (NG) | H level | L level |

As explained above, in the semiconductor circuit 40 of the present exemplary embodiment, when diagnosis is performed of the chopper-type comparator 26, the initialization operation places the capacitor C1 of the chopper-type comparator 26 in a charged state by the difference between the reference voltage VREF 1 and the auto-threshold voltage Vx (reference voltage VREF 1–auto-threshold voltage Vx), and the capacitor C2 in a charged state by the difference between the ground potential (voltage VSS) and the auto-threshold voltage Vx (ground voltage VSS–auto-threshold voltage Vx). In comparison operation 1 a voltage of 60% of the reference voltage VREF 1 is generated by resistance dividing, to supply the generated voltage to the capacitors C1, C2. Correct functioning is diagnosed when the output OUT=L level, and malfunction is diagnosed when the output OUT=H level. However, in comparison operation 2, a voltage of 40% of the reference voltage VREF 1 is generated by resistance dividing, to supply the generated voltage to the capacitors C1, C2. Correct functioning is diagnosed when the output OUT=H level, and malfunction is diagnosed when the output OUT=L level.

In the semiconductor circuit 40 according to the present exemplary embodiment, self-diagnosis of the chopper-type comparator 26 is performed based on logic values output from the chopper-type comparator 26 in states in which specific voltages are generated by the dividing resistor 44 with respect to the difference between the reference voltage VREF 1 generated by a reference voltage generation circuit 42 and the ground voltage VSS (the specific voltages in this case being a voltage of 60% of the reference voltage VREF 1 and a voltage of 40% of the reference voltage VREF 1).

Accordingly, since self-diagnosis of the chopper-type comparator 26 may be performed without requiring a dedicated section or the like, power consumption may be suppressed while also suppressing time required for processing, and appropriate diagnosis of the functioning of the chopper-type comparator 26 may be achieved.

Furthermore, while obviously similar effects may be obtained to those of the first exemplary embodiment, in the present exemplary embodiment however more precise diagnosis may also be performed due to performing diagnosis of the equalization function of the switching element SW after checking functioning of the chopper-type comparator 26 is operating correctly.

There are no particular limitations to the reference voltage VREF 1 to be generated by the reference voltage generation circuit 42, and the reference voltage VREF 1 may be appropriately determined based on such factors as the specification of the chopper-type comparator 26 and the voltage values of the cells C.

Whereas in the first exemplary embodiment and the second exemplary embodiment the diagnostic circuit 22 and the storage section 23 are configured internally to the semiconductor circuit 14 or 40 there is no limitation thereto, and the diagnostic circuit 22 and/or the storage section 23 may be configured as separate circuit(s) (on chip). Configuration may also be made with a function for performing disconnect detection instruction to the diagnostic circuit 22, and/or a function for performing diagnosis of whether or not there is line disconnect to a monitor from the logic value stored in the storage section 23, either configured in the semiconductor circuit 14 or 40, or configured as external circuit(s) (on a separate chip).

What is claimed is:

1. A semiconductor circuit comprising:
    a comparator section that compares discharge sections, each comprising
        a first signal line connected to a high potential side of each of a plurality of battery cells that are connected in series, and
        a second signal line connected to a low potential side of each of the plurality of battery cells,
        wherein each of the discharge sections is provided between the first signal line and the second signal line and discharges one of the plurality of battery cells, and
    wherein the comparator section compares a threshold voltage, pre-set according to a potential difference between a potential of the first signal line and a potential of the second signal line, with a voltage according to a potential between the first signal line and the second signal line, and
    wherein the comparator section includes, a single inverting amplifier, a first capacitor connected to an input of the single inverting amplifier and input with the potential of the first signal line or with the potential between the first signal line and the second signal line, and a second capacitor connected in parallel to the first capacitor and input with the potential of the second signal line or with the potential between the first signal line and the second signal line.

2. The semiconductor circuit of claim 1, wherein the threshold voltage is determined based on an electrostatic capacitance of the first capacitor and an electrostatic capacitance of the second capacitor.

3. The semiconductor circuit of claim 1 further comprising:
    a first switching element to connect each of the first signal lines to the comparator section; and
    a shorting switching element to connect each of the second signal lines to the comparator section.

4. The semiconductor circuit of claim 1 further comprising a diagnostic section to diagnose malfunction of the discharge section based on a comparison result of the comparator section.

5. The semiconductor circuit of claim 1 further comprising:
    a reference voltage generating section;
    a generating section that generates a specific voltage from the voltage generated by the reference voltage generation section; and
    a grounding section that supplies a ground potential,
    wherein the comparator section further compares a threshold voltage, set according to a difference between the voltage generated by the reference voltage generating section and a voltage according to ground potential, with the specific voltage generated by the generating section.

6. The semiconductor circuit of claim 5 further comprising a detecting section to detect malfunction of the comparator section based on a comparison result of the comparator section.

7. A battery cell monitoring system comprising:
    a plurality of battery cells connected in series;
    a discharge section comprising,
        a resistance element provided between a first signal line connected to a high potential side of each of the plurality of battery cells and a second signal line connected to a low potential side of each of the plurality of battery cells, and
        a discharge switching element connected in series to the resistance element; and
    the semiconductor circuit of according to claim 1.

8. A non-transitory computer readable medium storing a diagnostic program for causing a computer to execute a diagnostic process of a discharge section by a semiconductor circuit, the discharge section comprising, a first signal line connected to a high potential side of each of a plurality of battery cells connected in series, a second signal line connected to a low potential side of each of the plurality of battery cells, a resistance element provided between the first signal line and the second signal line, and a discharge switching element connected in series to the resistance element,
    the semiconductor circuit comprising a comparator section comprising,
        a single inverting amplifier,
        a first capacitor connected to an input of the single inverting amplifier and input with a potential of the first signal line or a potential between the resistance element and the discharge switching element, and
        a second capacitor connected in parallel to the first capacitor and input with a potential of the second signal line or a potential between the resistance element and the discharge switching element,
    wherein the comparator section compares a threshold voltage, set according to a potential difference between the potential of the first signal line and the potential of the second signal line, with a voltage according to the potential between the resistance element and the discharge switching element,
    the diagnostic process comprising:
    charging the first capacitor by a potential difference between the potential of the first signal line and the threshold voltage of the single inverting amplifier;

charging the second capacitor by a potential difference between the potential of the second signal line and the threshold voltage of the single inverting amplifier;

inputting to the first capacitor and the second capacitor a voltage according to the potential between the resistance element and the discharge switching element; and outputting a comparison result from the comparison section.

9. A diagnostic method for performing diagnosis of a discharge section by a semiconductor circuit, the discharge section comprising, a first signal line connected to a high potential side of each of a plurality of battery cells connected in series, a second signal line connected to a low potential side of each of the plurality of battery cells, a resistance element provided between the first signal line and the second signal line, and a discharge switching element connected in series to the resistance element, the semiconductor circuit comprising a comparator section comprising a single inverting amplifier, a first capacitor connected to an input of the single inverting amplifier and input with a potential of the first signal line or a potential between the resistance element and the discharge switching element, and a second capacitor connected in parallel to the first capacitor and input with a potential of the second signal line or a potential between the resistance element and the discharge switching element, wherein the comparator section compares a threshold voltage, set according to a potential difference between the potential of the first signal line and the potential of the second signal line, with a voltage according to the potential between the resistance element and the discharge switching element, the diagnostic method comprising:

charging the first capacitor by a potential difference between the potential of the first signal line and the threshold voltage of the single inverting amplifier;

charging the second capacitor by a potential difference between the potential of the second signal line and the threshold voltage of the single inverting amplifier;

inputting to the first capacitor and the second capacitor a voltage according to the potential between the resistance element and the discharge switching element; and outputting a comparison result from the comparison section.

\* \* \* \* \*